United States Patent [19]

Tsubai et al.

[11] Patent Number: 5,418,115
[45] Date of Patent: May 23, 1995

[54] METHOD FOR FORMATION OF IMAGE

[75] Inventors: Yasuo Tsubai; Kenji Hyodo, both of Tokyo, Japan

[73] Assignee: Mitsubishi Paper Mills Limited, Japan

[21] Appl. No.: 216,825

[22] Filed: Mar. 23, 1994

[30] Foreign Application Priority Data

Mar. 24, 1993 [JP] Japan .................................. 5-065048

[51] Int. Cl.$^6$ .............................................. G03C 5/00
[52] U.S. Cl. ..................................... 430/323; 430/264; 430/271; 430/302; 430/312; 430/313; 430/316; 430/325; 430/329; 430/407; 430/945
[58] Field of Search ............... 430/271, 945, 312, 313, 430/316, 325, 329, 407, 264, 323, 302

[56] References Cited

U.S. PATENT DOCUMENTS

| | | | |
|---|---|---|---|
| 3,920,717 | 11/1975 | Marion | 260/449.5 |
| 3,920,717 | 11/1975 | Marion | 260/449.5 |
| 4,110,359 | 8/1978 | Marion | 260/449.5 |
| 4,110,359 | 8/1978 | Marion | 260/449.5 |
| 4,202,167 | 5/1980 | Suggitt et al. | 60/39.02 |
| 4,202,167 | 5/1980 | Suggitt et al. | 60/39.02 |
| 4,268,609 | 5/1981 | Shiba et al. | 430/271 |
| 4,347,305 | 8/1982 | Shiba et al. | 430/273 |
| 4,666,818 | 5/1987 | Lake et al. | 430/261 |
| 4,946,477 | 8/1990 | Perka et al. | 48/197 R |
| 4,946,477 | 8/1990 | Perka et al. | 48/197 R |
| 5,015,553 | 5/1991 | Grandmont et al. | 430/273 |
| 5,208,134 | 5/1993 | Maruyama et al. | 430/271 |

*Primary Examiner*—Charles L. Bowers, Jr.
*Assistant Examiner*—Geraldine Letscher
*Attorney, Agent, or Firm*—Cushman, Darby & Cushman

[57] ABSTRACT

The present invention provides an image-forming material high in sensitivity, resolving power and quality of the formed image and excellent in resist property and stability which comprises a support, a non-photosensitive resist layer provided on the support and a photosensitive silver halide gelatin emulsion layer provided on the non-photosensitive resist layer. These layer can be provided on one or both sides of the support. Furthermore, an image-forming layer may be provided between the support and the non-photosensitive resist layer. The present invention further provides an image-forming method using the above image-forming material.

12 Claims, No Drawings

METHOD FOR FORMATION OF IMAGE

BACKGROUND OF THE INVENTION

The present invention relates to an image-forming material excellent in various performances such as sensitivity, resolution and quality of images formed and having various uses and a method for forming images using the image-forming material which is superior in operability and productivity. More particularly, it relates to a material which is very high in sensitivity, can be exposed with air-cooled argon laser beam, helium-neon laser beam or semiconductor laser beam and can form good resist images and a method for forming the resist images. Furthermore, it relates to production of a printed wiring board, formation of metallic masking images, production of name plates, minute working of metals and making of printing plates.

Silver halide gelatin emulsion photosensitive systems are generally high in sensitivity and resolution and excellent in consistency and storage stability. Therefore, the systems have hitherto been widely used in the fields of general photographic field, medical field and photomechanical field. However, a few of them have been used as a means for forming resists.

As mentioned above, the systems have many merits and if the formation of resists using the silver halide photosensitive systems can be advantageously attained, the systems can be widely applied. For example, they can be applied to minute working of metallic semiconductors and insulators and patterning of inorganic or organic thin films and especially they can be applied to the fields of working of materials relating to electronics and production of name plates and in addition, various art workings and printings.

Particularly, the techniques of designing and graphics using computer design CAD/CAM have recently made rapid progresses and the graphics technique using scanning output from lasers and LED arrays have already been put to practical use in various fields. There have been desired resist-forming materials high in sensitivity and high in quality of images formed which are adaptable to direct scanning exposure, especially laser scanning exposure and moreover, low energy laser beams such as air-cooled argon laser beam, helium-neon laser beam and semiconductor laser beam which are advantageous in cost and stable and a method for forming the resists has also been desired. The enhancement of sensitivity in the field of resist has also been desired in the field of general resists ("J. Soc. Photogr. Sci. Technol. Japan", Vol. 54, P684 (1991)). However, at present the sensitivity corresponding to 100 $\mu J/cm^2$ is the limit and there are problems in storage stability and image quality.

As examples of application of silver halide photosensitive systems, though they are not necessarily examples of resists, British Patent Nos.1,571,155 and 1,567,844 and U.S. Pat. No. 4,168,167 disclose photosensitive lithogrpahic printing plates comprising an aluminum support and a photosensitive silver halide emulsion layer directly provided on the support. However, these photosensitive lithographic printing plates have the problems such as occurrence of fogs and spots.

Furthermore, as examples of improvement of one of the problems, U.S. Pat. Nos. 4,268,609, 4,347,305 and 4,358,530 propose photosensitive lithographic printing plates which comprise an aluminum support and a photosensitive silver halide emulsion layer between which a non-silver photosensitive layer is provided. The non-silver photosensitive layer comprises (1) a diazo resin, (2) an o-quinonediazide, (3) a photosensitive azide compound, (4) a polymer compound containing —CH=CH—CO— group in the main chain or the side chain, (5) an addition polymerizable unsaturated compound, a photopolymerization initiator and a polymer compound as a binder or the like.

Furthermore, L. Plambeck et al proposed to make a printing plate by forming relief images by selective washing-off after exposure and development with use of a bifunctional color developing agent and a polymer coupler (J. Image. Sci., 30, 221 (1986)).

For example, in the field of printed wiring board, the screen printing process and the photographic process which use a liquid resist or a dry film resist are used for formation of resist images. With recent demand for enhancing performances of printed circuit boards, enhancement of sensitivity of photoresist or dry film resist has been studied (e.g., J. Soc. Photogr. Sci. Technol. Japan, Vol. 54, P684 (1991) and Application of New Photofunctional Polymer, CMC (1988)). However, sensitivity and resolution of the printed wiring boards produced using them are generally low and besides, the production steps are complicated. Therefore, many operational steps and much time are required for production of printed wiring boards.

Japanese Patent Kokai No. 63-129689 proposes a method for making printed wiring boards improved in these problems. That is, this method comprises directly drawing a circuit pattern on an organic photoconductive layer by laser beams, forming a toner image by electro-photographic process and making a printed wiring board using the toner image as the resist.

However, for making the above-mentioned photosensitive printing plate comprising a support and a photosensitive silver halide emulsion layer between which a non-silver photosensitive layer is provided (U.S. Pat. No. 4,268,605), an exposure to ultraviolet rays for exposing the non-silver photosensitive layer is required subsequent to the first exposure, development and fixation and thus, there are problems such as complicated systems of equipment and steps and deterioration of resolution owing to the low sensitivity of the non-silver photosensitive layer and owing to using a light source which lacks parallel properties.

Furthermore, the above-mentioned method comprising production of resist images by electro-photographic process (Japanese Patent Kokai No. 63-129689) have the following problems. That is, (a) charging of the organic photoconductive layer is necessary just before exposure and a special device must be provided, (b) the characteristics of the organic photoconductive layer depend greatly upon environmental conditions such as temperature and humidity, and (c) the organic photoconductive layer is apt to adsorb dusts, and spots are liable to be produced.

Moreover, according to the method of crosslinking of the polymer couplers with the oxide of the color developing agents, resolution lowers due to the diffusion of the oxide.

SUMMARY OF THE INVENTION

An object of the present invention is to provide an image-forming material high in sensitivity, resolving power and quality of images formed thereon and excellent in resist properties and stability and a method for forming an image using the image-forming material which is superior in operability and productivity and is economically advantageous. Another object of the present invention is to provide a high-sensitivity image-forming material suitable for laser scanning exposure using lasers or LED arrays and a method for forming an image using the material. Further object is to provide an image-forming material suitable for making printed wiring boards and a method for making them.

The above object has been attained by providing a non-photosensitive resist layer and then a photosensitive silver halide gelatin emulsion layer on one or both sides of a support.

The image forming method of the present invention comprises exposing imagewise the above-mentioned image-forming material, developing the material to form a silver image portion in the silver halide gelatin emulsion layer, removing the silver image portion by etching bleaching and then removing the exposed non-photosensitive resist layer by resist development.

The another image-forming material of the present invention comprises a support and an image-forming layer, a non-photosensitive resist layer and a photosensitive silver halide gelatin emulsion layer which are provided in succession in this order on one or both sides of a support.

The another image forming method of the present invention comprises exposing imagewise the above-mentioned image-forming material, developing the material to form a silver image portion in the silver halide gelatin emulsion layer, etching bleaching the silver image portion to expose the non-photosensitive resist layer, then subjecting the non-photosensitive resist layer to resist developing to expose the image-forming layer, removing the image-forming layer by etching, and then removing the remaining silver halide gelatin emulsion layer and the non-photosensitive resist layer.

DESCRIPTION OF THE INVENTION

The present invention will be explained in detail.

First, the image-forming material of the present invention will be explained.

The support has no special limitation and includes, for example, paper, plastics such as polyethylene, polypropylene, polyester, epoxy, polyimide, polyurethane and nylon, rubber and composites thereof, and metallic sheets such as iron, aluminum, zinc, nickel and copper and sheets of alloys thereof.

For the non-photosensitive resist layer in the present invention, there may be used any resins which can be subjected to resist development (dissolution and removal) using as a mask the gelatin relief image formed by etching bleaching of the photosensitive silver halide gelatin emulsion layer.

These resins are preferably organic solvent-soluble resins. Especially preferred are resins soluble in water-miscible polar solvents such as alcohols and glycol ethers and soluble in alkali in order that the toxicity of the solvents used for resist development can be lowered, troubles such as remaining of the resist in the subsequent washing step can be inhibited and the general decoating method with alkali can be performed at the final decoating step.

The representative examples of these resins are alkali-soluble novolak resins. The alkali-soluble novolak resins are known compounds prepared by addition condensation of phenols and aldehydes in the presence of acid catalysts. The phenols include, for example, phenol, o-cresol, m-cresol, p-cresol, o-ethylphenol, m-ethylphenol, p-ethylphenol, xylenol, α-naphthol and β-naphthol. The aldehydes include, for example, formaldehyde, paraformaldehyde and acetaldehyde. The acid catalysts include, for example, oxalic acid, hydrochloric acid, sulfuric acid, acetic acid and formic acid.

In addition to the alkali-soluble novolak resins, there may be exemplified resol resins, vinylphenol resins, polymers of vinylphenol derivatives in which a lower alkyl group such as methyl group or ethyl group is substituted on the benzene ring or vinyl group and N-(p-hydroxyphenyl)maleimide polymers. Further examples are styrene-maleic anhydride copolymer, polyvinyl hydroxybenzoate and carboxyl group-containing (meth)acrylic acid resins.

Especially preferred are phenol type or cresol type novolak resins or vinylphenol resins. The novolak resins and vinylphenol resins are superior in that they can substantially stand the alkali solution having a pH of 12 or less used for development of photosensitive silver halide gelatin emulsion layer and can maintain adhesion to the photosensitive silver halide gelatin emulsion layer.

Resins containing carboxylgroup can also be used as the non-photosensitive resist layer, but upon processing with a general alkaline photographic developer, these resins are dissolved or partially dissolved to cause such problems as peeling off of the photosensitive silver halide gelatin emulsion layer. When the resins containing carboxyl group are used as the non-photosensitive resist layer, there can be used neutral-weakly alkaline ascorbic acid developers or acidic developers containing inorganic metallic ions (such as divalent iron ion, trivalent titanium ion and divalent vanadium ion) as exemplified in U.S. Pat. No. 3,022,168.

The above-mentioned resins can be used each alone or in combination of two or more to form the non-photosensitive resist layer.

The solvents suitable for preparing coating solutions of the above resins to form the non-photosensitive resist layer include, for example, alcohols such as methanol, ethanol and propanol, ketones such as acetone, methyl ethyl ketone and methyl isobutyl ketone), ethylene glycol or its ethers and ether esters such as ethyl cellosolve and ethyl cellosolve acetate, propylene glycol or its ethers and ether esters, acetate esters such as methyl acetate and ethyl acetate, xylene, formamide, dimethylformamide, tetrahydrofuran, dioxane, dimethyl sulfoxide and acetonitrile. The water-miscible solvents are preferred and may be partially substituted with ammonia, amines or the like.

Furthermore, dyes, pigments or the like may be used each alone or in combination for formation of the non-photosensitive resist layer to improve resolution or to improve discrimination of the formed images. Of the pigments, carbon black is particularly preferred because it has light absorbability for the whole sensitive wavelength of silver halides. A disperse dye may also be used depending on the purposes. Moreover, white pigments such as titanium oxide function as a light reflective agent and are effective for improvement of discrimination and resolution of the formed images. In addition, materials which function to improve photographic stability of the silver halide gelatin emulsion such as mercapto heterocyclic compounds may also be added.

To ensure the adhesion between the non-photosensitive resist layer and the photosensitive silver halide gelatin emulsion layer provided on the resist layer is very important for advantageous practice of the present invention. In order to ensure excellent adhesion, for example, the following methods can be employed each alone or in combination. (1) The non-photosensitive layer is formed with addition of a cellulose derivative. (2) The non-photosensitive resist layer is formed with addition of a hydrophilic polymeric compound such as gelatin. (3) The non-photosensitive resist layer is formed with addition of polar fine particles such as titanium oxide and silica. (4) The non-photosensitive resist layer after formed (coated and dried) is subjected to surface activation treatment such as corona discharge. (5) An intermediate adhesion treatment customarily employed in the photographic field is carried out.

Furthermore, the coating solution may further contain surface active agents, plastisizing agents and others in order that the solution can be uniformly coated on the support.

The coating solution preferably has a concentration of 5–50% in terms of total solid content of the resins and others.

The coating amount of the coating solution is preferably about 0.5–20 $g/m^2$ in terms of solid content. For example, when the layer is formed using a novolak type phenolic resin and this is used as a resist for copper, it is preferred to uniformly coat the solution at an amount of 2–5 $g/m^2$ in terms of solid content in order to ensure a stable resist performance taking into consideration the irregularity of the surface.

The coating solution is coated on a support by a coater or the like in accordance with known methods and dried. There can be used plate-like spin coater, dip coater, spray coater and the like. When the support is a continuous film or laminate having a suitable flexibility, the coating solution can be continuously coated by air knife, extrusion or curtain coating.

In the photosensitive silver halide gelatin emulsion layer of the present invention, gelatin is basically used as a binder, but a part of it can be replaced with at least one of gelatin derivatives such as low molecular gelatin, phthalized gelatin and hydrophilic polymer binders such as starch, albumin, sodium alginate, hydroxyethylcellulose, gum arabic, polyvinyl alcohol, polyvinyl pyrrolidone, carboxy-methylcellulose, polyacrylamide, styrene-maleic anhydride copolymer and polyvinyl-methyl ether-maleic anhydride copolymer. Moreover, vinyl polymer aqueous dispersions (latexes) can also be used together.

The silver halide gelatin emulsion may be either of usual negative type emulsion or direct-positive type emulsion.

As the silver halides, there can be used silver chloride, silver bromide, silver iodide or mixtures thereof which are generally used for preparation of photosensitive materials. In order to obtain high-contrast and rapid developability, silver halides containing at least 30 mol % of silver chloride are preferred.

The average grain size of silver halide is preferably about 0.03–5μ, especially preferably 0.1–1μ.

The silver halide grains can be subjected to chemical sensitization such as sulfur sensitization, reduction sensitization or sensitization with salts of noble metals such as Ir, Rh, Pt and Au and spectral sensitization with sensitizing dyes. For the spectral sensitization, sensitizing dyes which give spectral sensitivity corresponding to the spectral wavelength of the light source used for imagewise exposure are selected. The grains may have either of surface latent image type or internal latent image type latent image distribution. The sensitizing dyes used for silver halide gelatin emulsions suitable for scanning exposure are dyes having absorption region for emission wavelength of the light source for the scanning exposure.

Mention may be made of, for example, the sensitizing dyes used in the case of exposure with helium-neon laser, argon ion laser, semiconductor laser and light emitting diode which are disclosed in U.S. Pat. No.4,501,811 and Japanese Patent Kokai Nos. 59-71055, 59-71056, 60-61752, 60-75838, 60-100148, 61-114235 and 63-47756, but these are not limitative.

The photosensitive silver halide gelatin emulsion layer may further contain ordinary additives such as coating aid, antifoggant, hardener, irradiation inhibiting dyes or pigments, matting agent and developing agent.

For formation of the photosensitive silver halide gelatin emulsion layer, there may be used any coating and drying methods which are employed in the field of general photography.

As a coating amount of the silver halide gelatin emulsion, generally about 4 $mmol/m^2$ as the amount of silver (0.5 g in terms of silver nitrate) is sufficient to ensure good photosensitive characteristics and image forming performances and to break and remove the binder mainly composed of gelatin using as a catalyst the silver formed by the development, and usually the silver halide emulsion is coated in an amount of about 5–30 $mmol/m^2$ (0.85–5.1 g in terms of silver nitrate).

In order to allow the etching bleaching to proceed efficiently with maintaining the film-formability, it is necessary to adjust properly the amount of the hardener in the photosensitive silver halide gelatin emulsion layer and furthermore to keep the ratio of the binder mainly composed of gelatin and the silver halide in a certain range. The ratio of the amount of binder (mainly composed of gelatin)/the amount of silver in terms of silver nitrate is preferably in the range of about $\frac{1}{2}$–5/1 (weight ratio). The optimal amount of the binder in the photosensitive silver halide gelatin emulsion layer is 2–5 $g/m^2$ and the optimal amount of silver in terms of silver nitrate is 0.5–5 $g/m^2$.

A non-photosensitive colloid layer may be provided on the surface of the photosensitive silver halide gelatin emulsion layer as a protective layer. This layer is mainly composed of gelatin and is preferably about 2 $g/m^2$ or less.

Formation of a resist image on the image-forming material of the present invention will be explained.

Any of the known imagewise exposing methods for silver halide emulsion photosensitive systems can be employed for the imagewise exposure in the present invention.

That is, conventional exposing methods such as contact exposure through a photo tool, projection exposure and flash exposure can be employed. Furthermore, there may also be employed various scanning exposures using low energy laser beams or LED arrays which cause no problems such as sticking of dusts to the surface of the resist and damaging of the photo tool and which are economical. Air-cooled argon laser, helium-neon laser and various semiconductor lasers are especially preferred.

In the imagewise exposure in the present invention, sensitivities of from a very low sensitivity of about 100 $mJ/cm^2$ to a high sensitivity of about 0.1 $\mu J/cm^2$ can be set by suitably selecting the components of the photosensitive silver halide gelatin emulsion layer, and from the viewpoint of spectral sensitivity, not only the light radiation energies such as ultraviolet rays, visible light and infrared rays, but also energy rays such as X-rays and electron rays can be used. Especially, monochromatic light or highly parallel light flux can be utilized and thus, drawing can be effected with high accuracy and with less defects.

For the development in the present invention, there may be used any developers and processing methods known in the silver halide photosensitive systems.

That is, as the developers for developing the imagewise exposed photosensitive silver halide gelatin emulsion layer, there may be used not only the developers used for development of ordinary silver halide photosensitive materials, but also the ultra-high contrast developers (such as lith developers and nucleation type high contrast developers containing hydrazine or derivatives thereof) used in the field of graphic arts. Furthermore, activator type processing solutions composed of an alkali agent can be used when the developing agent is contained in the photosensitive element. In this case, there are many merits as a total system, namely, developability is good and stable and the risk for environmental safety due to the developing waste solutions can be diminished.

Furthermore, it is possible to use the combined developing and fixing bath which simultaneously carries out the development and fixation by containing a solution of silver halide in the developer.

When phenolic resins such as novolak type phenolic resins and polyvinyl phenol are used for the non-photosensitive resist layer, pH of the developer should be set at about 12 or less and is preferably 9.5–11.5.

Ascorbic acid developers which can perform the development in the neutral to weakly acidic region and inorganic metal ion developers which can also perform development in the acidic region can also be used as aforementioned. These developers are inferior in the general storage stability, but have the merit of being able to be regenerated by electrolytic reduction.

Developers are selected and used which are suitable in view of the materials which finally form images, the materials of the non-photosensitive resist layer set in relation with the said materials, the composition of the silver halide gelatin emulsion and the total processing performances.

The processing with developers can be suitably performed by the methods described, for example, in T. H. James, "The Theory of The Photographic Process" 4th. Ed., Macmillan Publishing Co., Inc. (1977) and A. Sasai, "Shashin no Kagaku (Photographic Chemistry)", published from Shashin Kogyo Shuppan Co., Ltd. in Mar., 1982. For example, when so-called PQ developer excellent in storage stability and capable of carrying out high contrast development, namely, a developer basically composed of sodium carbonate, sodium sulfite and a small amount of potassium bromide together with hydroquinone and phenidone is used, the development can be effected by processing at a solution temperature of 20–40° C., preferably 25–35° C. for 10–120 seconds. Normally, pH of such developers is in the range of 10.5±0.5.

After the development, fixing treatment may be carried out using fixing agents containing thiosulfate, water-soluble aluminum salt and the like which are generally used in photographic treatment and the silver halide of the unexposed photosensitive silver halide gelatin emulsion layer may be removed.

In the method of the present invention, the fixation may not necessarily be carried out, but for example, if storage or test of image is effected after the development, it is preferred to carry out the stopping or fixing treatment which is customary in the photographic treatment.

The etching bleach in the present invention is a step to selectively remove the silver image portion formed by the imagewise exposure and the development in the photosensitive silver halide gelatin emulsion layer. In the silver image portion, radicals are generated by the reduction-oxidation reaction due to the silver particles and the gelatin is decomposed and removed by the radicals to form a relief image in conformity with the imagewise exposure.

Specifically, the etching bleach can be carried out by treating the photosensitive silver halide gelatin emulsion layer after subjected to imagewise exposure and development with a compositional solution containing basically a polyvalent metal ion and a peroxide. (Modern Photographic Processing, Vol.2, John Wiley & Sons (1976), p 346). The solution is known as an etching bleach solution for silver image portion and is partially used for reversing treatment, preparation of slides and preparation of colored images in the field of graphic arts.

The polyvalent metal ions include, for example, divalent copper ion, trivalent iron ion, tetravalent cerium ion and pentavalent vanadium ion. The peroxides include, for example, hydrogen peroxide and water-soluble organic peroxides (for example, organic peroxides manufactured by Nippon Oil & Fats Co., Ltd.).

Especially, a solution containing divalent copper ion and hydrogen peroxide is preferred from the points of etching bleaching performance and storage stability. A relief image formed by subjecting the photosensitive silver halide gelatin emulsion layer coated at a thickness of about $2\mu$ to imagewise exposure, development and etching bleach with this solution is very sharp and has an excellent resolution of higher than 250 lines/mm.

The solution containing divalent copper ion basically comprises (1) a soluble cupric salt such as cupric sulfate, cupric chloride or cupric nitrate and (2) an acid such as citric acid, acetic acid or EDTA serving to adjust pH and capable of being chelated with the divalent copper ion and a small amount of a halide such as soluble chloride or bromide for accelerating the reaction. Usually, aqueous hydrogen peroxide is stocked separately from the solution and they are mixed at the time of using and the mixture is used for etching bleaching. For several days after mixing the two solutions, the mixed solution is relatively stable and can be put to use, but it is industrially preferable to effect the etching bleach smoothly by a practical system where these solutions are optionally supplemented.

The temperature for etching bleach is usually 20°–30° C. and sufficient etching bleach can be performed in 10–120 seconds, usually in 60 seconds or less. After the treatment, the decomposition residue is removed by brushing or water jet serving also to clean the surface. This process is necessary for obtaining a good resist by the subsequent resist development.

In general, as methods for obtaining the gelatin relief image, in addition to the etching bleach, there are known a method of the tanning development by which a matrix is crosslinked with utilizing the oxide of the developing agent, a method of using the reaction of a binder polymer having a coupling function with the oxide of a bifunctional color developing agent and a method of obtaining a relief image by crosslinking. However, since the relief images obtained by these methods have fatal defects in resolution and edge characteristics, the etching bleaching method having no such defects and having the merits as aforementioned is preferred in the present invention.

The resist development in the present invention is a step of solubilize and removing the exposed (naked) non-photosensitive resist layer using as a mask the relief image composed of the remaining silver halide gelatin layer formed by the etching bleach of the silver image portion.

Specifically, the resist development is carried out by treating with a material which does not swell (not permeate into) the gelatin layer and dissolves the non-photosensitive resist layer.

Examples of such materials are alcohols such as methanol, ethanol, propanol and butanol, ketones such as acetone, ethylene glycol, diethylene glycol, triethylene glycol, propylene glycol, dipropylene glycol and glycerine and derivatives thereof, and nitrogen-containing solvents such as alkanolamines. Furthermore, various solvents desribed in "Pocket Book of Solvents" (published from Ohm Co., Ltd.) can also be used depending on the materials constituting the non-photosensitive resist layer. In addition, ethylene oxide-propylene oxide copolymer and derivatives thereof (Uniroove manufactured by Nippon Oil & Fats Co., Ltd) are high in safety and suitable. These materials are preferably those which are mainly composed of the solvents having a boiling point of 150° C. or higher, a flash point of 50° C. or higher and being water-miscible, taking into consideration the volatility, the harmfulness and the dangerousness. These are used practically in combination of two or three rather than used each alone.

The above-mentioned materials may be used in combination with some assistants. Such assistants include, for example, surface active agents, silane coupling agents and metal surface treating agents which strongly interact with the surface of, for example, copper to exhibit the blocking effect for inhibition of reprecipitation and sticking of the resist at the time of washing with water. Examples of the metal surface treating agents are hetero cyclic compounds containing nitrogen and sulfur and mercapto compounds. It is very effective to use surface active agents having general cleaning effect for emulsification of the resist. Typical examples are dioctylsulfosuccinates. For the same purposes, other anionic surface active agents and other nonionic, cationic or amphoteric surface active agents can be used. A preservative may be added to these materials in order to inhibit rotting which may occur during a long running period.

The resist development can be suitably effected usually at 20°-80° C. for from about 5 seconds and at longest 120 seconds. The image-forming material which has been subjected to the etching bleaching is allowed to contact instantaneously with the above-mentioned materials and can be subjected to rapid treatment of about 10-30 seconds in total by brushing or water jet.

Furthermore, another image-forming material of the present invention will be explained.

In the another image-forming material, the support is the same as explained above, but when the image-forming material is used for making printed circuit boards, the support must be an electrical insulation material such as plastics.

As the image-forming layer, mention may be made of, for example, metallic layers such as of copper, aluminum, nickel, silver and gold, metal oxide thin layers such as ITO and ceramics insulation thin films.

The thickness of this image-forming layer is preferably from several hundred Å to 100μ.

The non-photosensitive resist layer and the photosensitive silver halide gelatin emulsion layer in this image-forming material are the same as those explained above.

An explanation will be made on the method for forming images on this another image-forming material.

In this method, imagewise exposure and development of the image-forming material, etching bleach of the silver image portion and resist development of the non-photosensitive resist layer are the same as explained above.

In this method, the image-forming layer exposed by the resist development is removed by etching. The etching of the image-forming layer can be carried out by known etching solutions and etching methods selected depending on the materials which constitute the image-forming layer.

For example, in the case of a support clad with copper which is one embodiment of the present invention, the etching can be satisfactorily performed by using known etching solutions for copper. Specifically, there can be used ferric chloride, cupric chloride, ammonium persulfate, hydrogen peroxide and others which are mentioned in various books such as J. A. Scarlet, "Handbook of Multilayer Printed Circuit", translated by Yoshimi Shimada, published from Kindai Kagaku Co., in 1992, and Naraoka et al, "Photo Etching and Minute Processing" published from Sogo Denshi Shuppan Co., in May, 1977. In the case of the image-forming layer being aluminum, this can be etched with a mixed composition containing, for example, phosphoric acid, nitric acid and acetic acid. In the case of a chromium film, a composition containing potassium ferricyanide or a composition containing ceric nitrate and hydrogen peroxide can be used.

The removal of the non-photosensitive resist layer and the photosensitive silver halide gelatin emulsion layer is a step of treating with an alkali solution to decoat only the photosensitive silver halide gelatin emulsion layer and the non-photosensitive resist layer which remain on the support together with the image-forming layer after etching of the image-forming layer.

As the alkali solution, there may be suitably used aqueous solutions of alkali metals having a pH of 12 or higher such as sodium hydroxide and potassium hydroxide.

There may be also employed a method of removing only the photosensitive silver halide gelatin layer with retaining the non-photosensitive resist. A method for removal by decomposition using enzymes such as pepsin can also be employed. Alternatively, the removal can be performed by treating with a mixture comprising the above-mentioned resist solvent and water at a suitable ratio.

The following examples are illustrative of the practice of the present invention and are not intended for purposes of limitation.

Example 1

The following non-photosensitive resist solution was coated on the surface of copper foil of a one-side copper-clad laminate comprising a polyester film support of 50μ thick and a rolled copper foil of 18μ thick clad on the support.

Composition of the non-photosensitive resist solution:

| | |
|---|---|
| Novolak type phenolic resin (Sumilite Resin manufactured by Sumitomo Durez Co.) | 10 g |
| p-Polyvinylphenol resin (manufactured by Maruzen Petrochemical Co., Ltd.) | 3 g |
| 1-Methoxy-2-propanol | 80 g |
| Carbon black (20% dispersion) | 1 g |
| Titanium oxide (20% dispersion) | 5 g |

The coating was carried out by a rod wound with a stainless steel wire of 0.90 mil. The coating amount actually measured in wet state was 21 g/m² and the resin thickness after dried was about 3μ. After drying, the coat was cured at 100° C. for 10 minutes.

Thereon was continuously and uniformly coated the following silver halide gelatin emulsion at a wet coating weight of 35 g/m² by an air knife type coater and then dried with dry air of 45° C.

The silver halide gelatin emulsion used was so-called silver chlorobromoiodide emulsion which contained 95 mol % of silver chloride, 4 mol % of silver bromide and 1 mol % of silver iodide, had an average grain size of 0.33μ and was orthochromatically sensitized. The emulsion contained 60 g of gelatin and 0.36 mol of silver halide for 1 kg of the emulsion and futhermore, 30 ml of 1% aqueous glyoxal solution and 5 ml of 10% aqueous formaldehyde solution for 1 kg of the emulsion were added. After the emulsion was coated and dried, the sample was warmed at 40° C. and 65%RH overnight.

The thus obtained image-forming material was subjected to the following processes and treatments in succession to make a copper printed wiring board.

<Exposure>

The image-forming material was subjected to contact printing with a resolving power chart to form a latent image by a vacuum contact printer (P-615-D manufactured by Dainippon Screen Mfg. Co., Ltd.) having a tungsten lamp as a light source.

In the same manner as exposing a lith film to a printed circuit pattern, another sample was subjected to a direct exposure corresponding to 5–10 μJ/cm² by a photo plotter used for preparation of photo tools (using air-cooled argon laser of sensitivity 488 nm) (Response-280 manufactured by Sytex Co.) to form a latent image.

<Development>

Subsequently, the latent image was developed with the following developer. The temperature of the developer was 25° C. and development was carried out for 20 seconds.

Composition of the developer:

| | |
|---|---|
| Water | 700 ml |
| Anhydrous sodium sulfite | 45 g |
| Hydroquinone | 12 g |
| Phenidone | 1 g |
| Sodium carbonate (monohydrate) | 80 g |
| Potassium bromide | 2 g |
| Water to make up 1000 ml in total. | |

This developer was diluted with water to (1:1) for use. The developer in use had a pH of 10.3.

<Etching bleach>

The sample was squeezed by rubber rolls and then immediately dipped in the following etching bleach solution.

Composition of the etching bleach solution:

| | |
|---|---|
| Solution A: | |
| Water | 750 ml |
| Copper sulfate | 120.0 g |
| Citric acid | 150.0 g |
| Potassium bromide | 7.5 g |
| Water to make up 1000 ml in total. | |
| Solution B: | |
| 3% Aqueous hydrogen peroxide | |

The solution A and the solution B in equal amount (500 ml) were mixed to prepare a working solution. The temperature of the solution was 23° C. The sample was dipped in this working solution. After about 10 seconds, the exposed and developed black silver portion (silver image portion) dissolved and began to peel off, but the sample was dipped for 30 seconds in total. Then, the sample was washed by water jet, squeezed by rollers and dried.

<Resist development>

Next, resist development was carried out. The sample was dipped in the following solution for resist development at 23° C. for 5 seconds and washed with a water jet.

Composition of the solution for resist development:

| | |
|---|---|
| Polyether synthetic oil | 80 g |
| Ethanol | 20 g |
| Monoethanolamine | 5 g |
| Sodium dioctylsulfosuccinate | 5 g |

In this way, the non-photosensitive resist layer was resist developed and thus, the portion of the non-photosensitive resist layer subjected to the exposure, development and etching bleach was removed to expose copper in that portion. A part of the samples were dried for evaluation of the image characteristics of the resist.

<Copper etching>

Subsequently, the sample was transferred to an etching bath to carry out copper etching. The etching was carried out in a tentatively fabricated spray type etching tank. The etching solution used was an etching solution for printed wiring boards mainly composed of ferric chloride (H-1000A manufactured by Sun Hatoya Co., Ltd.). The temperature of the spray solution was 45° C. Since the minimum etching time required for etching of a 18μ copper-clad laminate prepared as a blank was 40 seconds, the copper etching was carried out for 60 seconds which was 1.5 time the minimum etching time for the blank.

<Decoating>

Then, the sample was washed with water and dipped in a 0.1N sodium hydroxide solution for 10 seconds at 25° C. to peel off the remaining non-photosensitive resist layer and photosensitive silver halide gelatin emulsion layer. The sample was sufficiently washed with water, squeezed by rubber rolls and then dried. A clear copper pattern was formed on the polyester film support.

<Evaluation>

The sample was observed by a microscope to find no defects such as pin holes, etch pits, etc. The contact printed image of the resolving power chart was evaluated to find that for the resist image taken at the stage prior to the copper etching, the image of 100 lines/mm was definitely formed.

Furthermore, it was confirmed that when a copper foil of 18μ thick was used, line & space of 30μ could be obtained as a circuit pattern by argon laser exposure.

Example 2

An image-forming material was prepared in the same manner as in Example 1 except that a polyester film support of 100μ thick subjected to hydrophilic treatment was used in place of the one-side copper clad laminate comprising a polyester film support of 50μ clad with a rolled copper foil of 18μ.

The resulting image-forming material was subjected to imagewise exposure, development and resist development in the same manner as in Example 1 except that the copper etching and the decoating were not carried out and the material was dipped in a mixed solution of ethanol:water=1:1 for 30 seconds to remove only the silver halide gelatin emulsion layer and washed with water and then dried.

<Evaluation>

The sample was observed by a microscope to find no defects such as pin holes, etch pits, etc. The contact printed image of the resolving power chart was evaluated to find that an image of 100 lines/mm was definitely formed.

Furthermore, a pattern of line & space of 30μ could be obtained by argon laser exposure.

Ink-receptivity test: The surface was wiped with water and an offset ink was fed onto the surface by a manual roller to find the the resist image satisfactorily received the ink.

As explained above, the image-forming material of the present invention is provided with a photosensitive silver halide gelatin emulsion layer on the surface. Therefore, sensitivity of the conventional photoresist or dry film resist is about 1–10 mJ/cm$^2$ while the photosensitive silver halide gelatin emulsion layer has generally very high sensitivity of higher than 0.1 μJ/cm$^2$ and besides is high in resolving power and hence, the sensitivity and the resolving power of the image-forming material of the present invention are both very high.

In addition, since the silver halide gelatin emulsion can be imparted with a high spectral sensitivity to X-rays and electron rays as well as ultraviolet rays, visible light and infrared rays, the image-forming material of the present invention can select and set the spectrum in a wide range depending on the purposes.

The methods very advantageous from the points of sensitivity, resolving power and economy, such as direct patterning with low energy output laser beams can be applied to the image-forming material of the present invention.

Furthermore, since a non-photosensitive resist layer is provided under the photosensitive silver halide gelatin emulsion layer in the image-forming material of the present invention, the image-forming material of the present invention can be an unlimitedly high function layer and can have a high resist property.

As a result, the present invention can provide an image-forming material high in sensitivity, resolving power and quality of image formed and excellent in resist properties and stability.

The image forming method of the present invention comprises combination of conventionally known simple processes using the above-mentioned high performance image-forming material and hence the method is excellent in operability and productivity and besides can economically form images of high performance.

Therefore, printed wiring boards and photo masks of high performances can be made by the method of the present invention and the method can be applied to a wide variety of techniques such as minute processing of metals, photo-fabrication, patterning of functional thin films and preparation of high-performance printing pates.

Furthermore, by carrying out laser scanning exposure for imagewise exposure in the present image forming method, printed wiring boards, photo masks and printing plates excellent in resolution, sensitivity and image quality and free from the problems such as sticking of dusts to the surface of resists and damaging of photo tools can be produced further satisfactorily.

What is claimed is:

1. A method for forming a resist image which comprises the steps of:
   (a) imagewise exposing an image-forming material comprising a support having thereon in the following order, on one or both sides, a non-photosensitive resist layer and a photosensitive silver halide gelatin emulsion layer;
   (b) developing the image-forming material to form a silver image portion in the photosensitive silver halide gelatin emulsion layer;
   (c) removing the silver image portion by etching/bleaching; and
   (d) removing the exposed non-photosensitive resist layer by resist development.

2. A method according to claim 1 wherein the imagewise exposure is a scanning exposure by a laser beam or an LED array.

3. A method according to claim 1 wherein the etching/bleaching is carried out with a processing solution containing divalent copper ion and hydrogen peroxide.

4. A method according to claim 1 wherein the resist development is carried out with a processing solution containing at least one compound selected from the group consisting of lower alcohols and ethylene oxide-propylene oxide copolymers.

5. A method according to claim 4 wherein the processing solution contains a surface active agent.

6. A method according to claim 5 wherein the surface active agent is a dioctylsuccinate.

7. A method for forming a resist image which comprises the steps of:
   (a) imagewise exposing an image-forming material comprising a support having thereon in the following order, on one or both sides, an image forming layer, a non-photosensitive resist layer and a photosensitive silver halide gelatin emulsion layer;
   (b) developing the image-forming material to form a silver image portion in the photosensitive silver halide gelatin emulsion layer;
   (c) removing the silver image portion by etching/bleaching to expose the image-forming layer;
   (d) removing the exposed image-forming layer by etching; and
   (e) removing the remaining photosensitive silver halide gelatin emulsion layer and non-photosensitive resist layer by resist development.

8. A method according to claim 7 wherein the imagewise exposure is a scanning exposure by a laser beam or an LED array.

9. A method according to claim 7 wherein the etching/bleaching is carried out with a processing solution containing divalent copper ion and hydrogen peroxide.

10. A method according to claim 7 wherein the resist development is carried out with a processing solution containing at least one compound selected from the group consisting of lower alcohols and ethylene oxide-propylene oxide copolymers and derivatives thereof.

11. A method according to claim 10 wherein the processing solution contains a surface active agent.

12. A method according to claim 11 wherein the surface active agent is a dioctylsuccinate.

* * * * *